United States Patent [19]

Simko

[11] 4,314,265
[45] Feb. 2, 1982

[54] DENSE NONVOLATILE ELECTRICALLY-ALTERABLE MEMORY DEVICES WITH FOUR LAYER ELECTRODES

[75] Inventor: Richard T. Simko, Los Altos, Calif.

[73] Assignee: Xicor, Inc., Los Altos, Calif.

[21] Appl. No.: 6,026

[22] Filed: Jan. 24, 1979

[51] Int. Cl.³ .................................. H01L 29/78
[52] U.S. Cl. ............................ 357/23; 357/41;
357/54; 357/59; 365/185
[58] Field of Search .............. 357/23, 41, 59, 51, 357/54; 365/185

[56] References Cited

U.S. PATENT DOCUMENTS

| | | | |
|---|---|---|---|
| 3,728,695 | 4/1973 | Frohman-Bentchkowsky | 365/185 |
| 3,825,946 | 7/1974 | Frohman-Bentchkowsky | 357/23 |
| 3,856,587 | 12/1974 | Yamazaki et al. | 357/23 |
| 3,878,549 | 4/1975 | Yamazaki et al. | 357/23 |
| 3,906,296 | 9/1975 | Maserjian et al. | 357/23 |
| 3,925,804 | 12/1975 | Cricchi et al. | 357/23 |
| 4,037,242 | 7/1977 | Gosney | 357/23 |
| 4,050,965 | 9/1977 | Ipri et al. | 357/23 |
| 4,099,196 | 7/1978 | Simko | 357/23 |
| 4,112,509 | 9/1978 | Wall | 357/23 |
| 4,115,914 | 9/1978 | Harai | 357/23 |
| 4,122,543 | 10/1978 | Bert et al. | 357/23 |
| 4,122,544 | 10/1978 | McElroy | 365/185 |
| 4,146,902 | 3/1979 | Tanimoto et al. | 357/23 |

Primary Examiner—Joseph E. Clawson, Jr.
Attorney, Agent, or Firm—Fitch, Even, Tabin, Flannery & Welsh

[57] ABSTRACT

A compact, floating gate, nonvolatile, electrically-alterable memory device fabricated with four layers of polysilicon is described. A particular form of the device utilizes asperities to promote tunnel current flow through relatively thick oxides by means of relatively low average applied voltages. The use of four electrode layers leads to an extremely dense cell and memory array configuration.

14 Claims, 5 Drawing Figures

DENSE NONVOLATILE ELECTRICALLY-ALTERABLE MEMORY DEVICES WITH FOUR LAYER ELECTRODES

This application is related to contemporaneously filed, copending applications Ser. No. 6,030, now U.S. Pat. No. 4,274,012, entitled "Substrate Coupled Floating Gate Memory Cell" filed Jan. 24, 1979 and Ser. No. 6,029 entitled "Nonvolatile Static Random-Access Memory Cell" filed Jan. 24, 1979, which are incorporated herein by reference.

The present invention is generally directed to nonvolatile semiconductor memory devices and methods, and more particularly is directed to nonvolatile MOS floating gate memory systems utilizing four layers of gates and electrodes in a compact cell arrangement.

In data processing systems, memory devices and methods for the storage of information are of critical importance. A long-standing practical problem associated with semiconductor technology is that most conventional semiconductor memory elements are volatile, i.e., when power is removed, the content of the memory is lost. Many structures have been proposed or demonstrated for providing nonvolatility together with electrical alterability to semiconductor memory circuits. However, practical difficulties such as limitations on the number of useful erase/write cycles which may be effected during the lifetime of the device, retention time of data by the memory device and operational restrictions limiting ease of use or the ability to carry out electrical modification of the stored data, have tended to restrict the utility of such nonvolatile semiconductor devices having a floating gate structure. In this regard, devices based on a MOS (metal-oxide-semiconductor) floating gate structure are conventionally employed in nonvolatile electrically-alterable memory structures. Such devices use a floating gate island of conducting material, which is electrically insulated from the substrate, but capacitively coupled to the substrate to form the gate of a MOS transistor adapted to sense the state of charge of the floating gate. Depending on the presence or absence or charge on the floating gate, this MOS transistor may be placed in a conducting ("on") state or nonconducting ("off") state for storage of binary "1"s or "0"s. Various means of introducing and removing the signal charge from a floating gate have been used in such memory devices. Charge can be introduced onto the floating gate using hot electron injection and/or so-called "tunneling" mechanisms. The term "tunneling" is used herein in a broad sense to include the emission of an electron from the surface of a conductor into an adjacent insulator through the energy barrier. Once charge is introduced to a dielectrically isolated floating gate, it remains (effectively) permanently trapped on the gate because the floating gate is completely surrounded by an insulating material, which acts as a barrier to the discharging of the floating gate. However, charge can be removed from the floating gate by exposure to radiation (UV light, X-rays), avalanche injection, or by tunneling effects.

Various device structures are conventionally utilized to convey charge to and from the floating gate and a substrate [Frohmann-Bentchkowsky, "A Fully-Decoded 2048-Bit Electrically Programmable MOS-ROM", Digest 1971, IEEE International Solid State Circuits Conference, pp. 80–81; U.S. Pat. No. 3,660,819, U.S. Pat. No. 3,996,657]. However, high currents must be drawn during writing of electrons to the floating gate ("programming") of such devices because only a small fraction of the programming current is sufficiently displaced and energetic to reach the floating gate through the relatively thick oxide (e.g., 1000 Angstroms). Another technique is to use a very thin oxide of precisely predetermined thickness, in the range of from approximately 50 to 200 Angstroms, to separate the floating gate from a programming terminal in the substrate [E. Harari, "A 256-Bit Nonvolatile Static RAM", Digest 1978, IEEE International Solid State Circuits Conference, p. 109 U.S. Pat. No. 3,500,142]. Charge is "tunneled" to and from a floating gate element with bidirectional symmetry though a relatively thin (50–200 Anstroms) oxide, the direction depending upon the electric field vector. Because of the bidirectionally symmetrical character of the tunnel oxide, the nonvolatile cell may be subject to possible disturb problems which cause the memory to lose its contents. In particular, examples of disturb problems include limitations in the number of read cycles and cell memory content being affected by adjacent cell operations. Moreover, it is difficult to reliably manufacture such very thin oxide layers of precisely controlled thickness and electrical properties in large-scale production.

Enhanced tunneling between multiple layers of polysilicon may form the basis for additional nonvolatile elements, and various semiconductor devices using such enhanced tunneling have been proposed [DiMaria and Kerr, "Interface Effects and High Conductivity in Oxides Grown from Polycrystalline Silicon", Applied Physics Letters, pp. 505–507, November, 1975; Andersen and Kerr, "Evidence for Surface Asperity Mechanism of Conductivity in Oxides Grown in Polycrystalline Silicon", J. Applied Physics, pp. 4834–4836, Vol. 48, No. 11, November, 1977; U.S. Pat. No. 4,009,196; Berenga, et al., "E$^2$PROM TV Synthesizer", 1978 IEEE International Solid State Circuits Conference, pp. 196–197]. Such enhanced tunneling permits relatively thick oxides to separate tunneling elements, using relatively conventional programming voltages. However, such conventional nonvolatile semiconductor memory devices still have various disadvantages and limitations, and improved floating gate semiconductor devices would be desirable. In this connection, conventional floating gate memory devices may use relatively high voltages and currents for charging and discharging the floating gate, and such voltages and currents present isolation and design difficulties and limitations with respect to integrated circuit elements associated with the memory device, and may provide disturbance problems for adjacent memory cells in an array of such cells. Further, at the present time, the manufacturing yield of integrated circuits is an approximately negative exponential function of actual device layout area. Therefore, for the same integrated circuit minimum line width design rules, a significant increase in yield may be provided by reducing nonvolatile memory cell area, and such higher yield is related directly to lower manufacturing cost.

Accordingly, it would be desirable to provide nonvolatile, electrically-alterable memory cells of compact design and favorable electrically properties, and it is an object of the present invention to provide such an improved, dense electrically-alterable, nonvolatile semiconductor memory element.

It is another object of the invention to provide an electrically-alterable, nonvolatile memory device comprising an integrated circuit array of a plurality of such elements which are readily accessible without disturbance to the other elements in the array.

These and other objects of the invention will become apparent in connection with the following detailed description and the accompanying drawings of which:

Figure 1:
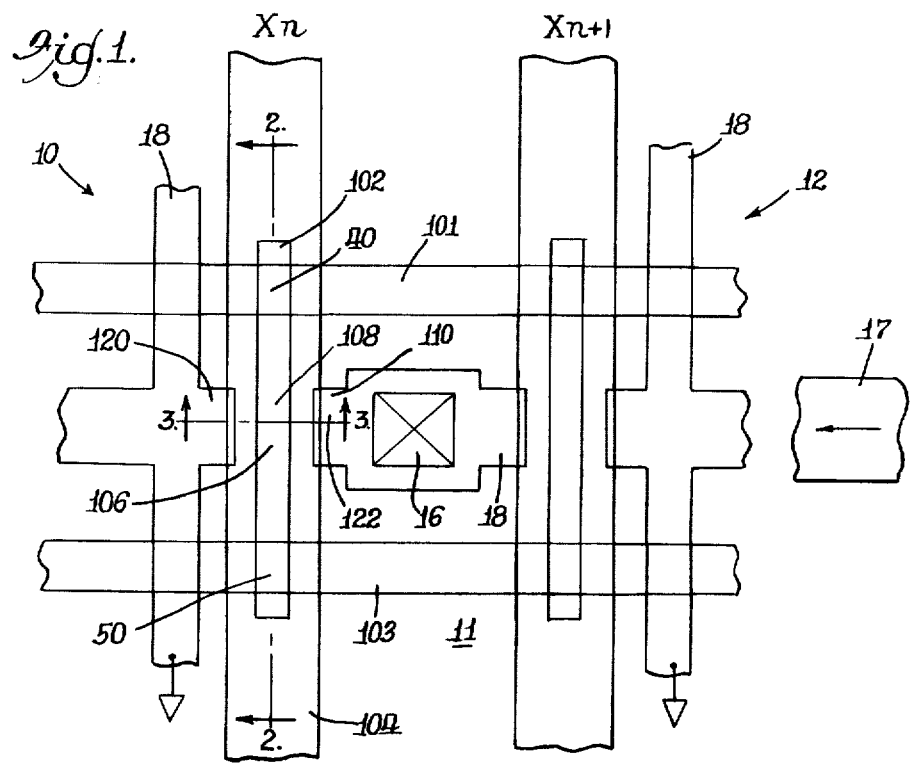
FIG. 1 is a plan view of an embodiment of a pair of nonvolatile, electrically-alterable floating gate four-layer cells in accordance with the present invention.

Generally, the present invention is directed to compact, nonvolatile, electrically-alterable semiconductor memory elements of the floating gate type which may be constructed from four layers of conductive material, such as polycrystalline silicon, deposited on a semiconductor substrate. The invention is also directed to methods for charging and discharging the floating gate of such devices.

Devices in accordance with the invention comprise a substantially monocrystalline semiconductor substrate, an electrically isolated floating gate conductor overlying the substrate, electron injection means for introducing electrons onto the floating gate to provide the floating gate with a negative potential, and electron removal means for removing electrons from the floating gate to provide said floating gate with a potential more positive than said negative potential. The devices further comprise a bias electrode which is capacitatively coupled to the floating gate, and means for detecting the potential state of said floating gate.

The various elements of the devices forming the means for introducing electrons onto the floating gate and the means for removing electrons from the floating gate, together with the floating gate itself, may be formed in a four layer polysilicon structure above the monocrystalline semiconductor substrate. In accordance with such construction, the semiconductor substrate is not required to isolate the relatively high voltages utilized in introducing or removing electrons from the floating gate during the writing of information to the device for storage therein, and need only be adapted to utilize the relatively low voltages and currents involved in the reading, or interrogation, of the device to determine the information previously stored in the device.

As indicated, the devices comprise a substantially monocrystalline semiconductor substrate of one conductivity type, and in this connection p-type monocrystalline silicon wafers are the preferred substrate, although n-type silicon substrate wafers, epitaxial monocrystalline n- or p-type layers on a monocrystalline dielectric substrate such as sapphire or other semiconductive materials are contemplated for different embodiments of the invention.

As also indicated, the present devices comprise at least one floating gate, electrically-isolated conductor overlying the substrate. A portion of the floating gate forms the gate of a MOS sensing transistor in the semiconductor substrate so that the charge state of the floating gate may be sensed for reading of the charge state memory contents of the device. The floating gate conductor may be a conducting polysilicon gate surrounded completely by an insulating material, such as thermally-grown silicon dioxide. The floating gate may be separated from the substrate in the region of the MOS sensing transistor by conventionally (e.g., thermally) grown silicon dioxide dielectric layers of readily manufacturable thickness, such as in the range of from about 500 to 1500 Angstroms thick, and may be separated from the substrate by thicker oxide layers at other regions of the floating gate. As will be described in more detail hereinafter, the means for removing charge from the floating gate may comprise a portion of the floating gate in capacitive relationship with an overlying erase electrode. The upper surface of the floating gate disposed away from the semiconductor substrate and toward the erase electrode may be fabricated in such a manner to contain a large population of asperities, which are minute areas of polysilicon with many sharp, needle-like protrusions. Electron emission can occur from such points to the overlying erase electrode (which may also be fabricated of polycrystalline silicon), at relatively low applied voltages of less than about 30 volts. Such an enhanced electron transport may be due to enhanced Fowler-Nordheim tunnel emission and other mechanisms.

The means of injecting charge onto the floating gate may comprise a program control electrode similarly fabricated from polysilicon and underlying a portion of the floating gate. The program control electrode may similarly be provided with an upper surface provided with asperities such that electron emission from the program control electrode to the floating gate may be similarly carried out at relatively low applied voltages of less than 30 volts potential difference between the program control electrode and the floating gate.

As also indicated, means for sensing the stored charge on the floating gate is provided, and in this connection a portion of the floating gate may form the gate of a sense transistor formed in the substrate. Depending on the electric charge level on the floating gate, the sense transistor may be rendered conducting (on) or nonconducting (off). For example, in an n-channel MOS sense transistor device, when sufficient electrons are present on the floating gate, the sense transistor is rendered nonconductive. On the other hand, when enough electrons are removed from the floating gate to cause its potential to be positive relative to the substrate underneath it, then the n-channel sense transistor is rendered conductive. The conductive or nonconductive state of the floating gate sense transistor forms a mechanism for detecting the presence or absence of charge on the floating gate and thus provides the basis for reading the information stored in the cell as a charge level on the floating gate.

An important element of the present devices is a bias electrode located above and insulated from the floating gate. A primary function of the bias electrode is to properly bias by capacitive action the floating gate during the introduction of electrons onto the floating gate (write cycle). The bias electrode also functions to properly bias the floating gate by capacitive action during removal of electrons from the floating gate (erase cycle). The bias electrode may be formed from a fourth layer of polysilicon deposited over the programming electrode, the floating gate, and the erase electrode, so that of these elements, the bias electrode is most remotely located from the semiconductor substrate. If the bias electrode is brought sufficiently positive with respect to the programming electrode underlying the floating gate, electrons will tunnel from the programming electrode to the floating gate, which in turn alters the floating gate potential. As indicated, this relatively negative charge thus provided can be sensed by a suitable means such as a sensing transistor. Similarly the erase electrode, which at least partially overlaps the floating gate and is insulated from the floating gate, may be brought to a predetermined high potential while the bias electrode is held at a predetermined low potential so that electrons will tunnel from the floating gate to the erase electrode. In this manner, the floating gate may be provided with a relatively more positive voltage than the substrate underneath it, which can be sensed by a suitable means such as a sensing transistor. Further, like the bias electrode, a potential applied to the erase electrode is at least partially shielded from the substrate by the floating gate.

The nonvolatile, electrically-alterable floating gate semiconductor memory elements may be fabricated in a four layer electrode and gate structure from a material such as polysilicon. A portion of the first layer is overlapped by and is insulated from the second layer and each of the other two layers. A third layer overlaps a portion of the second layer and is insulated from the second layer and each of the other two layers. A fourth layer substantially overlaps and is insulated from the second layer and all other layers. The second layer forms the floating gate to which and from which electrons can be transported or tunneled, by application of voltages applied to the other layers. The presence or absence of electrons can be detected by a remote portion of the floating gate which gates a sense transistor and thereby functions as a memory element. All of the polysilicon layers can be insulated from the substrate material, which is preferably a monocrystalline silicon substrate, but which may also be of other semiconductive material. The resulting structure is a dense nonvolatile electrically-alterable MOS element structure having favorable electrical characteristics.

Turning now to the drawings, the present invention will now be more particularly described with respect to the specific embodiment of an n-channel, nonvolatile electrically-erasable semiconductor device 10 illustrated in the drawings. Although the device 10 is a n-channel MOS device, it will be appreciated that other device technologies such as p-channel configurations may also be utilized and are contemplated herein.

Figure 2:
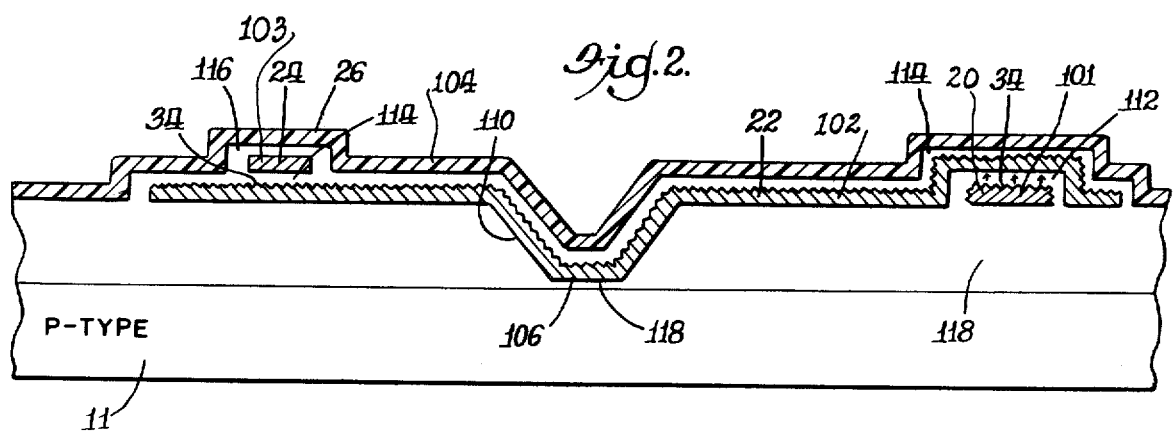
FIG. 2 is a cross sectional side view of one of the nonvolatile electrically-alterable memory cells of FIG. 1, taken through line 2—2.
Figure 3:
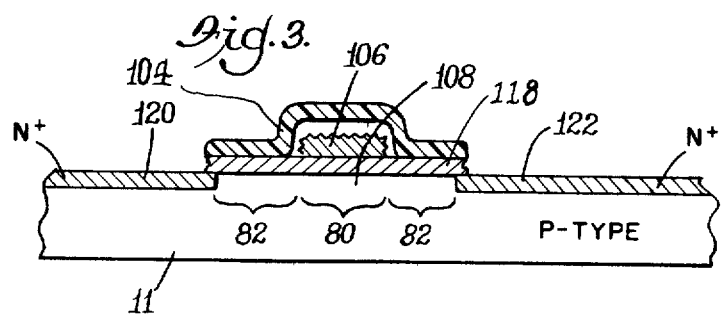
FIG. 3 is a cross sectional side view of one of the nonvolatile electrically-alterable cells of FIG. 1 taken through line 3—3.

As illustrated in FIGS. 1-3, the nonvolatile memory cell 10 is constructed from a substantially monocrystalline p-type silicon semiconductor substrate 11, and four subsequently sequentially deposited, patterned, etched and insulated layers 20, 22, 24, 26. These polysilicon layers respectively form a programming electrode 101, an overlying floating gate 102, an erase electrode 103 overlying the floating gate, and a bias electrode 104 overlying the erase electrode, programming electrode and floating gate. A part 106 of the floating gate 102 forms the gate of a sense transistor 108 in sense transistor channel 110 for sensing the electric potential charge state of the floating gate 102.

A mirror-image symmetrical cell 12 is associated with the cell 10 to form a cell pair which may be repeated to form a memory array extending in both the X (up-down) and Y (left-right) directions. In such an array, the bias electrode 104 (and the bias electrode of the other cells) will extend to contiguous cells to form X select word lines of the array. The two cells 10, 12 share a common drain 16 which connect in an array to metal line 17 for a Y-select sensing of the cell. An N-type implant channel 18 in the p-substrate 11 forms common source lines in the X direction and, the MOS sensing transistor channels for the cells 10, 12. In operation, the substrate may be biased to about $-2$ to $-4$ volts, the n-type channel may be biased to about 0 volts, and programming and erase voltage of plus 25 volts may be applied to the polycrystalline electrodes. X-Y decoding circuitry may be provided in accordance with conventional practice.

The polycrystalline silicon layers which form the electrodes, 101, 103, 104 and gate 102, including the electron injecting means 40 and the floating gate electron emission inducing means 50, may be deposited, patterned, etched and oxidized in accordance with conventional practice. Silicon dioxide dielectric layers 112, which in the illustrated embodiment are grown from the respective silicon substrate or polysilicon elements by conventional thermal oxidation techniques to an inter-element thickness of about 1000 Angstroms, isolate the substrate and polysilicon layers from each other. The floating gate 102, the electron injecting means 40, and the electron removing means 50 are formed of polysilicon layers suitably sequentially deposited, and etched and oxidized to form the illustrated device structure, which is shown in FIGS. 1-3. In FIG. 1 the various elements are shown as if they were transparent so that the underlying electrode structure may be illustrated. Further detail of the device structure is shown in the cross-sectional views of FIGS. 2 and 3.

In the fabrication of the illustrated embodiment 10, means 40 for injecting electrons to the floating gate, comprising a program electrode 101 is fabricated from the first polysilicon layer 20 which is deposited on the silicon dioxide dielectric layer 118 formed by thermal oxidation of the substrate 11. The first polysilicon layer 20 is treated to produce surface asperities 34, by oxidation at approximately 1000 degrees C. After etching and oxidation of the first layer 20 to form the program electrode 101 and oxide 112, the second polysilicon layer 22 is deposited and a similar procedure is performed on the second layer 22 of polysilicon used to form the floating gate 102. In the same manner, asperities 34 are provided on the upper surfaces of the floating gate 102. The asperities are small projections at the surface which are present in numerous quantity (e.g., there may be an areal density of $5 \times 10^9$ asperities per $cm^2$). A larger portion of the asperities may have an average height greater than their base width (e.g., a base width of about 450 Angstroms and a height of about 750 Angstroms). The asperities are believed to be capable of producing high local fields at relatively low average field strength, thus reducing the inter-electrode field strength necessary for transport or tunneling of electrons from electrode having the asperities to the adjacent electrode under the influence of an appropriate electric field therebetween. Without limiting the invention to any particular theoretical explanation, it is theorized that these high local fields are sufficient to inject electrons into relatively thick oxides (for tunneling purposes) while on the average a relatively low voltage is applied across the oxide. However, the electron transport enhancement provided by the asperities 34 is not bidirectional. When a smooth electrode surface lacking such asperities is relatively negatively biased with respect to another electrode, electrons are not injected into the thick oxide at the relatively low voltages which will produce electron transfer from a surface possessing asperities under otherwise identical conditions. Accordingly, it will be appreciated that the program electrode 101 and its associated asperities 34 form a diode-like structure with the adjacent smooth undersurface of the floating gate 102. This structure will transport electrons from the program electrode through the separating 1000 Angstrom thick oxide 112 when the floating gate is positively biased with respect to the programming electrode 101 at a voltage difference of less than 30 volts. However, when the programming electrode 101 is positively biased with respect to the floating gate 102 at identical voltage difference of less than 30 volts, electrons are not transported from the floating gate to the program electrode. The same diode-like characteristic is provided between the floating gate and the erase electrode 103, with the enhanced transport occuring from the floating gate to the erase electrode 103 when the erase electrode is positively biased with respect to the floating gate 102. Suitable asperities 34 for producing such characteristics can be produced over a range of conditions and a range of sizes, and are not limited to the particular example stated above.

A third polysilicon layer 24 is deposited (after etching and oxidation of the second floating gate layer) over the floating gate 102 and processed to form an erase electrode 103, which in conjunction with the asperities on the top surface of the floating gate 102 forms the means 50 for removing electrons from the floating gate, as previously indicated.

A fourth polysilicon layer 26 is deposited (subsequent to the etching and oxidation of the third layer 24) substantially over the entire floating gate and is processed to form a bias electrode 104 which acts to appropriately bias the floating gate during the write, erase, and read operations. While not shown in the drawings for purposes of simplification, an insulating silicon dioxide layer is provided over the electrode 104.

The oxides separating the various polysilicon layers 20, 22, 24, 26 may be fabricated by well-known techniques such as thermal oxidation. Similarly, the patterned polysilicon layers 20, 22, 24, 26 may be patterned and fabricated by well-known semiconductor photolithographic techniques, which accordingly need not be further described herein.

The overlapping region between the floating gate 102 and the programming gate 101 (FIG. 2) is the area in which electrons tunnel through the separating oxide 112 from the programming gate to the floating gate. By appropriately biasing the floating gate 102 with positive polarity in respect to the progamming electrode 101, electrons will tunnel from the programming electrode 101 to the floating gate 102. The electron charge is injected from the asperities 34 at the surface of the program control electrode by enhanced tunneling into the separating oxide 112 and travels to and is collected by the floating gate 102 under the influence of the positive bias. After the biasing voltage is removed from the floating gate 102, the tunneled electrons are confined on the floating gate as they do not have the energy to surmount the isolating oxide energy barrier. The electrons may be retained substantially indefinitely on the floating gate unless removed, and provide a negative electric charge to the floating gate which is sufficient to turn off the MOS sense transistor 108.

Electrons may be removed from the floating gate by means of the erase electrode 103 which is separated by a silicon dioxide dielectric layer 114 disposed adjacent to a portion of the surface of the floating gate 102 which is provided with asperities 34. By appropriately biasing the erase gate 103 at a sufficiently high positive potential with respect to the floating gate, electrons may be caused to tunnel from the asperities on the upper surface of the floating gate to the erase gate. In this manner the floating gate 102 may be provided with a relatively positive charge, which is sufficiently positive to turn on the n-channel MOS transistor 108. The overlapping region between the erase electrode 103 and the floating gate 102 is the area in which electrons tunnel through the separating oxide 114 from the floating gate to the erase electrode. In the illustrated embodiment, these oxides 112, 114 are approximately 1000 Angstroms thick and are thus easily manufacturable in a reliable and reproducible manner. In this connection, while a 1000 Angstrom silicon dioxide dielectric thickness is used in the illustrated embodiment as an optimum thickness, the optimum thickness may decrease as manufacturing techniques are improved.

As indicated, means is provided for sensing the potential of the floating gate 102, and in this connection, as shown in FIGS. 1, 2 and 3, a portion 106 of the floating gate 102 beneath the bias electrode 104 forms the gate electrode of a MOS sense transistor comprising source and drain regions 120, 122 of N+ conductivity type separated by intermediate portions 80, 82 of the p-type substrate 11 modulated by the bias gate 104 and zone 80 is modulated by the floating gate. The conductivity of the region between the source and drain is thus modulated by the bias gate 104 and the series gate portion 106 of the floating gate. In the illustrated embodiment 10, the regions 82 form enhancement transistors which require the bias gate 104 to be adequately positively biased relative to the substrate in regions 82 in order to allow conduction of current from source to drain (if also the floating gate is on). The regions 82 may also be fabricated as depletion devices (which are normally on), such that the floating gate electrode portion 106 would directly modulate the source to drain current of the sense transistor 108, although the enhancement mode is conventionally used when the cells are in an array.

In operation of the device 10, the floating gate 102 is either charged with an excess number of electrons, which causes its voltage to be low (negative) and thereby functions to turn off the remotely located sense transistor 108, or the floating gate is charged relatively positive by a removal of electrons which causes its voltage to be high, thereby turning on the sense transistor 108. The on or off nature of the sense transistor 108 forms the basis for detecting the memory state of the floating gate 102 of the device 10. This memory state of the floating gate 102 may be altered by introducing (or "programming") electrons into the gate, and by removing (or "erasing") electrons from the gate.

It should be appreciated that in the operation of the device 10, the cell substrate 11 may be utilized only during the low voltage and low current memory interrogation (reading). By requiring only low voltage and current for the cell substrate, many constraints or limitations for both manufacturing and design are removed.

The four-layer cell electrode structure of the illustrated embodiment 10 provides a fast, low power, rapidly alterable and long-term data retaining memory cell which is easy to manufacture, dense (therefore, relatively low cost) and has favorable resistance to so-called disturb limitations. Because of the relatively low field required for tunneling (e.g., $2.5 \times 10^6$ volt/cm), reasonably thick oxides (1000 Angstroms) may be used between polysilicon layers. Both features strongly favor standard manufacturing techniques and reasonable circuit design techniques. Yet another important advantage of this cell is that during the high voltage, (e.g., about +25 volts) program and erase operations of the cell 10, the silicon substrate 11 of the cell does not have to support or isolate high voltages or currents. Thus, because the electron source and sink structures for charging and discharging the floating gate 102 are fabricated from polysilicon layers dielectrically removed from the substrate 11, all of the "action" takes place above the substrate in the electrode structure formed from the four polysilicon layers 20, 22, 24, 26.

Figure 4:
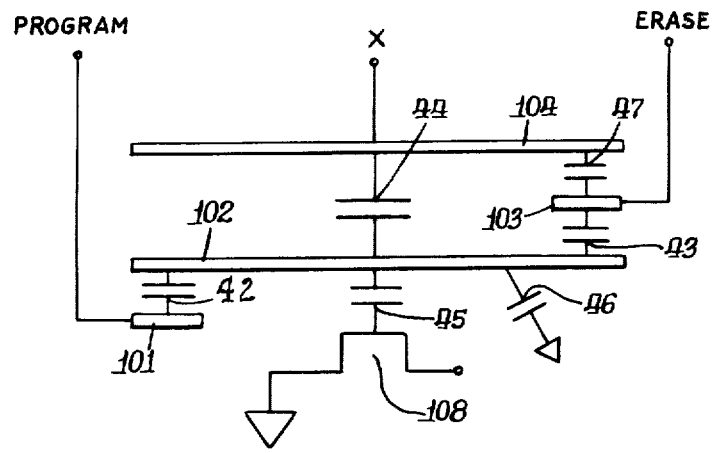
FIG. 4 is a schematic representation of the nonvolatile electrically-alterable floating gate cell of FIG. 1.

Turning now to FIG. 4, the operation of the device 10 will now be further described with respect to the circuit schematic of the cell 10 as there shown. The programming electrode 101 forms a capacitor 42 having a capacitance CP with the adjacent surface of the floating gate 102 and provides charge (electrons) to the floating gate when a sufficient voltage is developed across the capacitor 42. When the floating gate is charged negative, the field effect transistor 108 is "off". The floating gate 102 also forms a capacitor 43 having a capacitance CE with the erase electrode 103. When the floating gate 102 is charged positive, as when electrons are tunneled from the floating gate 102 through erasing capacitor 43 the field effect transistor 108 is "on". The erase electrode 103 provides a charge sink for charge removal from the floating gate 102 when the voltage across capacitor 43 is large enough to tunnel electrons from the floating gate 102. The introduction of electrons onto the floating gate 102 is referred to as "programming" and the removal of electrons from the floating gate is referred to as "erasing".

The bias electrode 104 which is formed from the fourth polysilicon layer 26 forms a relatively large capacitor 44, having a capacitance CX, with the floating gate. The capacitor 44 provides electrical potential coupling to the floating gate through the large capacitor 44 having a capacitance CX. During programming the electrical potential of the bias electrode is made "high" (~25 volts). During erasing the potential of the bias electrode 104 is made "low" (~0 volts). The bias electrode 104 also functions as the conventional "word" line in a memory array of the cells 10.

The floating gate 102 also forms a gate capacitor 45 to the FET channel for the sensing transistor 108. A field capacitor 46 having a parasitic capacitance CF to the substrate is also formed under the field oxide. This capacitor degrades the programming, and should be minimized.

A further parasitic capacitor 47 that does not enter into device operation is also formed in the device 10.

Capacitor 47 exists because the layout sandwiches the polysilicon layer 24 between layers 22 and 26.

The capacitance CX of word line capacitor 44 should best be several times larger than any of the other individual capacitors illustrated in FIG. 4. The capacitance CX of capacitor 44 couples potential to the floating gate 102 for programming, erasing, and reading.

To make the cell 10 functional and to optimize its performance and layout, suitable capacitance relationships should be maintained to ensure that strong enough fields occur in capacitors 42, 45, 43 for programming, reading and erasing, respectively.

In the table below (see FIG. 1 is listed a summary of typical conditions which may be utilized in the operation of the illustrated cell 10. These conditions illustrate cell operation, but are not intended to limit the more general description of operation.

| | CELL OPERATION | | | |
|---|---|---|---|---|
| Mode | Bias Gate | Program Gate | Erase Gate | YR |
| Program | 25 | 0 | 0 | 0 |
| *Erase | 0 | 25 | 25 | 0 |
| Read | ~5 | 0 | 0 | ~5 |

CELL OPERATING VOLTAGE TABLE - 25 volts is a single pulse
*To erase only one cell, only the erase gate need be raised to about 25 volts. When the cell is in an array, however, the programming gate of the illustrated embodiment must also be raised to prevent disturbing the data in adjacent cells as will be described further.

Figure 5:
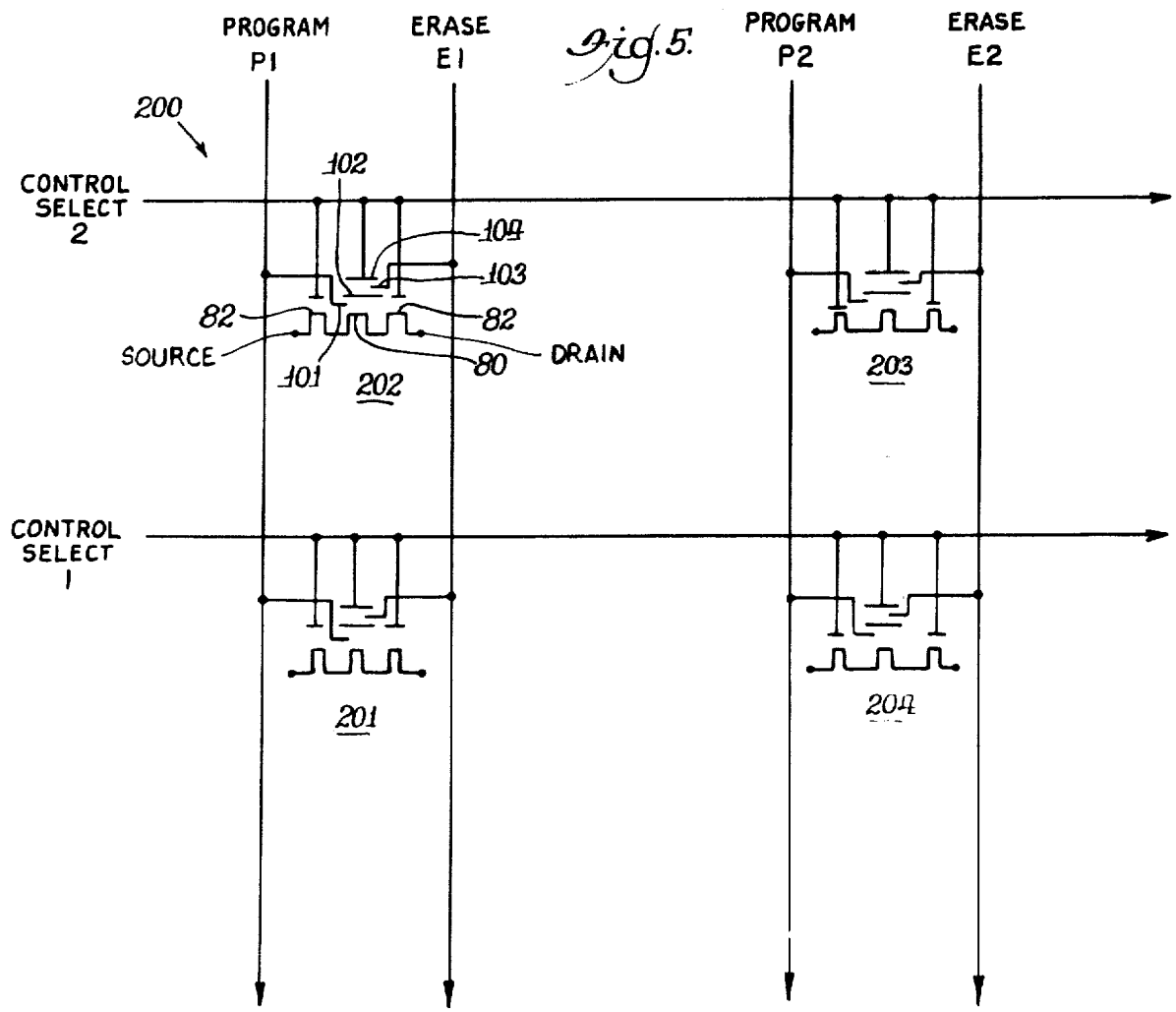
FIG. 5 illustrates a symbolic circuit schematic of the cells of FIG. 1, and further illustrates a plurality of the devices of the present invention in a memory array.

An important feature of the compact cell 10 is that it can be operated in a dense array of compact cells. FIG. 1 illustrates two cells sharing a common sense transistor channel contact, which may form a repeating unit in a large, integrated circuit array of memory cells. The unit cell dimensions of the illustrated cell pair 10,12 of FIG. 1 are about 42 microns (X direction) and 46 microns (Y direction) for 4 micron design rules. In such an array, if a single cell is written, erased or read, then these operations should not disturb or modify the data in adjacent cells. In connection with discussion of such operation in a cell array, a symbolic representation of individual memory single cells depicted in FIG. 5 which are each equivalent to the cell 10 shown in FIGS. 1, 2 and 3. The polysilicon bias electrode may continue from cell to cell across the array for cell selection purposes and accordingly will be referred to as a control/select gate in the following description so as to make clear its function in an array. In FIG. 5, an array of cells each substantially like device 10 is schematically shown interconnected in a useful memory array which may be expanded in both the X and Y directions to form a very large memory device 200. In the illustration of the array, the cell 201 and its surrounding neighbors, 202 and 204, and a diagonally adjacent cell 203 are shown. Cell 201 can be written, erased and read in the array without disturbing the immediately and diagonally adjacent cells 202, 203 and 204. Typical conditions impressed on the array of FIG. 5 for each of the elements of the array, to perform the various memory functions, may be set forth as follows:

| FUNCTION | P1 | C/S1 | E1 | P1 | C/S2 | E1 | P2 | C/S2 | E2 | P2 | C/S1 | E2 |
|---|---|---|---|---|---|---|---|---|---|---|---|---|
| Program Cell 201 | 0 | 25 | 0 | 0 | 0 | 0 | 25 | 0 | 0 | 25 | 25 | 0 |
| Erase Cell 201 | 25 | 0 | 25 | 25 | 25 | 25 | 25 | 25 | 0 | 25 | 0 | 0 |
| Read | | | | | | | | | | | | |

| FUNCTION | P1 | C/S1 | E1 | P1 | C/S2 | E1 | P2 | C/S2 | E2 | P2 | C/S1 | E2 |
|---|---|---|---|---|---|---|---|---|---|---|---|---|
| -continued | | | | | | | | | | | | |
| Cell 201 | 0 | 5 | 0 | 0 | 0 | 0 | 0 | 0 | 0 | 0 | 5 | 0 |

In the table, it is useful to elaborate on a few conditions. While programming or writing cell 201 the control/select line 1 is provided with a voltage pulse of plus 25 volts. In order not to program adjacent cell 204, the program line P2 is simultaneously maintained at approximately plus 25 volts also, so as to prevent electrons from entering the floating gate of the unselected cell 204. However, with program line P2 equal to 25 volts in cell 203, one might at first glance believe electrons would flow from the floating gate on cell 203 to the program select line P2. However, this will not happen because of the diode-like characteristic provided to the floating gate charging and discharging structure by the asperities, which tend to conduct in a preferred singular direction opposite the condition present in this disturb example. Therefore, the memory charge content of cell 203 is not disturbed. "Disturbance" is meant here to mean inadvertent altering of memory charge content of a nonaddressed cell by reading, inadvertent programming or erasing. Observation of cell 202 clearly shows no disturb conditions exist because all cell voltages are low.

Similarly, cell 201 may be erased without disturb problems in adjacent cells 202, 203, or 204. In this case the erase gate E1 is at plus 25 volts and the control/select line 1 is at 0 volts. Control/select line 2 is biased at plus 25 volts, to prevent disturbing cell 202. In turn program line P1 and program line P2 are accordingly biased to plus 25 volts to prevent disturbance to the memory charge content of cells 202 and 203. In this case one sees 25 volts between program line P1 and control select line 1 in cell 201 and 25 volts between program line P2 and control/select line 2 of cell 204. Disturbance problems are similarly prevented in cell 204 because the polarity of the voltage difference is not that for which the asperities of the cell provide enhanced electron transport. Accordingly, the unindirectional enhancement properties of the asperities are utilized to prevent disturbance problems in adjacent cells during "erasing" or removal of electrons from the floating gate of a selected cell. In the read operation, only potentials of plus 5 volts and 0 volts are present. Therefore, no significant disturb problems can occur because the electrical fields developed are too low. It will be appreciated that by simple symmetry relationship conditions, a large array of memory cells may be constructed with no disturb problems, and that the device of the invention is suitable for incorporation in a large array.

While the present invention has been particularly described with respect to the illustrated embodiment, it will be appreciated that various alterations, modifications and adaptations may be made based on the present disclosure, and are intended to be within the spirit and scope of the present invention.

In this connection, it will be appreciated that devices, and arrays of such devices, are compatible with various integrated circuit technologies such as CMOS (including CMOS/SOS) and bipolar integrated circuit design, and may be used in integrated circuit incorporating CMOS and bipolar integrated circuit elements. It will be further appreciated that while the illustrated embodiment covers a particular overlapping arrangement of the tunneling regions of the devices, narrow gap devices in which the tunnel regions are not overlapped, but have asperities laterally adjacent surfaces of the electrode and floating gate and are of sufficient lateral proximity to provide for tunnel current, may be provided. Further, the nonvolatile electrically programmable devices may be used in electrical connection in integrated circuit array with volatile memory elements such as RAM cells to provide nonvolatile memory devices such as nonvolatile RAM devices.

The ready erasure and programmability, and isolation of the programming and erasing voltages from the substrate, provide for particular utility of the device in integrated circuit adaptations, for example. The device may be used as means for disconnecting or connecting defective or redundant memory elements in a large integrated circuit memory array to provide fault tolerance to the memory array. Defective memory elements or memory loops in an integrated circuit having memory devices or loops suitably connectable or disconnectable by means of floating gates of such devices may be readily disconnected during testing following manufacture to increase the manufacturing yield. Disconnection of failed memory elements or loops, and/or addition of redundant or spare memory elements or loops may be subsequently carried out under control of the devices to prolong or repair the operation of the memory device. Similarly, devices in accordance with the present invention may be used in an integrated circuit microcomputer chip to reconfigure the logical elements (including register, memory, etc.) and busses of the microcomputer to provide a dynamically reconfigurable microcomputer device.

In the provision of such fault tolerant and dynamically reconfigurable systems, it will be appreciated that the floating gate of the nonvolatile devices may form the gate of a MOS switch transistor, the conducting or nonconducting of which may be utilized to connect or disconnect the desired elements of the integrated circuit.

Various features of the invention are set forth in the following claims.

What is claimed:

1. A nonvolatile, electrically-alterable floating gate memory device comprising:
   a semiconductor substrate,
   a dielectrically isolated floating gate conductor,
   means for detecting electrical charge on said floating gate conductor comprising a MOS sense transistor formed in said substrate and modulated by a portion of said floating gate conductor,
   means for introducing electrons onto said floating gate conductor comprising a first electrode intermediate said substrate and said floating gate conductor,
   means for removing electrons from said floating gate conductor comprising a second electrode overlying said floating gate conductor such that said floating gate conductor is intermediate said substrate and said second electrode,
   means for capacitively biasing said floating gate conductor comprising a bias electrode overlying said second electrode and said floating gate conductor such that said second electrode and said floating gate conductor are intermediate said bias electrode and said substrate, and dielectric means for insulating each of said electrodes from said substrate and from adjacent electrodes.

2. A device in accordance with claim 1 wherein the surface of said first electrode adjacent said floating gate and the surface of said floating gate adjacent said second electrode are each provided with asperities.

3. A device in accordance with claim 1 wherein said second and said bias electrodes are fabricated from a conducting material other than polysilicon.

4. A device in accordance with claim 1 wherein said substrate has CMOS or CMOS/SOS fabricated elements therein.

5. A device in accordance with claim 1 wherein said substrate has bipolar process fabricated elements therein.

6. A device in accordance with claim 1 in integrated circuit memory array with a plurality of substantially like devices forming an integrated circuit memory component.

7. A device in accordance with claim 1 in electrical connection with a random access memory (RAM) cell to form a nonvolatile RAM integrated circuit device.

8. A fault tolerant integrated circuit memory device comprising an input/output (i/o) system and a plurality of memory elements, rendered switchably connectable and disconnectable with respect to said i/o system by means of nonvolatile electrically alterable floating gate memory devices in accordance with claim 1.

9. A dynamically reconfigurable integrated circuit microcomputer chip comprising a plurality of logical elements and busses rendered switchably interconnectable by means of nonvolatile, electrically alterable floating gate memory devices in accordance with claim 1.

10. A nonvolatile, electrically-alterable floating gate memory device comprising:

a semiconductor substrate;

a dielectrically isolated floating gate conductor;

means for selectively sensing the electrical charge on said floating gate conductor;

a first electrode intermediate said substrate and said floating gate conductor for introducing electrons onto said floating gate conductor;

a second electrode overlying said floating gate conductor, such that said floating gate conductor is intermediate said substrate and said second electrode, for removing electrons from said floating gate;

a bias electrode overlying said second electrode and said floating gate conductor such that said second electrode and said floating gate conductor are intermediate said bias electrode and said substrate, for biasing said floating gate conductor to a positive potential to enable said first electrode to introduce electrons onto said floating gate conductor, and for biasing said floating gate conductor to a more negative potential to enable said second electrode to remove electrons from said floating gate conductor; and means for dielectrically insulating each said electrode from said substrate and from adjacent electrodes.

11. A device in accordance with claim 10, wherein said means for sensing the electrical charge of said floating gate conductor comprises:

a sense transistor having a source and a drain formed in said substrate, and a gate of said sense transistor, said gate including a first region whose conductivity is modulated by the electrical charge of said floating gate conductor, and at least one additional region positioned in a series relationship with said first region and said transistor source and drain, whose conductivity is modulated by the present potential of said bias electrode.

12. A device in accordance with claim 11, wherein said regions are formed at a point on said substrate where said means for dielectrically insulating said electrodes from said substrate is of a lesser thickness, said floating gate and bias electrode being positioned closer to said substrate at this point than at other points with respect to said substrate.

13. A device in accordance with claim 6, wherein said bias electrode extends to contiguous memory cells in said array to form X select word lines in said array, a metal conductor connected to contiguous sense transistors in said array for Y select sensing of the present state of said floating gate in a selected cell; a program word line connected to first electrodes in contiguous cells in a given column of said array; and an erase select line connected to second electrodes in contiguous cells in a given column of said array.

14. A device in accordance with claim 1, wherein said MOS sense transistor includes a source and a drain formed in said substrate, and a gate, said gate including a first region whose conductivity is modulated by the electric charge of said floating gate conductor, and at least one additional region positioned in a series relationship with said first region between said transistor source and drain, whose conductivity is modulated by the present potential of said bias electrode.

* * * * *